United States Patent
Icher et al.

(10) Patent No.: US 7,221,549 B2
(45) Date of Patent: May 22, 2007

(54) CIRCUITRY FOR PROTECTING ELECTRONIC CIRCUITS AGAINST ELECTROSTATIC DISCHARGES AND METHODS OF OPERATING THE SAME

(75) Inventors: François Icher, Grenoble (FR); Bruno Dehos, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 556 days.

(21) Appl. No.: 10/724,012

(22) Filed: Nov. 26, 2003

(65) Prior Publication Data
US 2004/0165327 A1 Aug. 26, 2004

(30) Foreign Application Priority Data
Nov. 28, 2002 (FR) .................... 02 14962

(51) Int. Cl.
*H02H 9/00* (2006.01)
(52) U.S. Cl. ........................................ 361/56
(58) Field of Classification Search ............... 361/56
See application file for complete search history.

(56) References Cited

U.S. PATENT DOCUMENTS

| | | | |
|---|---|---|---|
| 4,806,999 A * | 2/1989 | Strauss ................. | 257/357 |
| 4,876,584 A * | 10/1989 | Taylor .................. | 257/358 |
| 5,514,892 A | 5/1996 | Countryman et al. | |
| 5,838,043 A | 11/1998 | Yuan | |
| 6,157,065 A | 12/2000 | Huang et al. | |
| 6,388,851 B1 * | 5/2002 | Pettersson ............. | 361/56 |
| 6,621,680 B1 * | 9/2003 | Segervall ............... | 361/111 |

FOREIGN PATENT DOCUMENTS

| | | |
|---|---|---|
| EP | 1 130 650 A2 | 9/2001 |
| WO | WO 00/48252 | 8/2000 |

* cited by examiner

*Primary Examiner*—Ronald W. Leja

(57) ABSTRACT

A device for protecting an electronic circuit against electrostatic discharges comprises a connection terminal linked to one terminal of the electronic circuit, two tracks respectively linked to two terminals of an electrical power source supplying the electronic circuit, and two diodes each one linked to one of the two tracks and to the connection terminal. The two diodes are placed on a surface of a substrate. The connection terminal is carried by the substrate and is located above part of at least one of the two diodes with respect to the substrate.

20 Claims, 1 Drawing Sheet

CIRCUITRY FOR PROTECTING ELECTRONIC CIRCUITS AGAINST ELECTROSTATIC DISCHARGES AND METHODS OF OPERATING THE SAME

TECHNICAL FIELD OF THE INVENTION

The present invention relates to a device for protecting an electric circuit against electrostatic discharges (ESD), and more particularly to such a device intended to be used in an integrated electronic circuit.

BACKGROUND OF THE INVENTION

Electronic circuits may be damaged by electrostatic discharges occurring at their electrical connection terminals. Such electrostatic discharges may in particular occur when the electronic circuit is handled by an operator or by a handling robot, in particular when fabricating this circuit. It is known to place a device for protecting the circuit against electrostatic discharges at at least some of the terminals of the circuit, so as to prevent the damage caused to the circuit by electrostatic discharges occurring at these terminals.

A protective device known to a person skilled in the art comprises two diodes connected in parallel to one terminal of an electronic circuit, and respectively connecting this terminal to two rails, each one connected to a respective terminal of a DC power source supplying this circuit. One of the diodes has its anode connected to the terminal of the circuit, and its cathode connected to the one of the two rails which has the highest electrical potential, hereinafter the first rail. The other diode has its cathode connected to the terminal of the circuit and its anode connected to the one of the two rails which has the lowest electrical potential, hereinafter the second rail. A voltage-limiting device, called a "clamp" in the jargon of a person skilled in the art, is also connected between the first and second rails. The voltage-limiting device is designed so as to become an electrical conductor with a low ohmic resistance when the electrical voltage between the first rail and the second rail is greater than the voltage of the power source, or is negative.

Thus, electric charges of an electrostatic discharge occurring on said terminal of the circuit are removed by the first rail to the DC power source, when the discharge is positive, and by the second rail when the discharge is negative. The electronic circuit is thus preserved. The two diodes and the two rails must have a high ability to conduct electric currents, so that large numbers of electrical charges can be removed quickly and without excessive heating.

Such a protective device further comprises an external connection terminal electrically linked to the terminal of the electronic circuit. The external connection terminal comprises a conducting region which is large enough to allow electrical connections to be made between this connection terminal and electrical devices external to the electronic circuit. These connections are, for example, made by metal wires soldered to the external connection terminal.

Both diodes of such a protective device made on a substrate of an integrated electronic circuit are placed at the side of the external connection terminal, to which they are electrically connected. Overall, the protective device consequently occupies a region of the substrate which is at least equal to the combination of the region of substrate occupied by the connection terminal itself and the region of the substrate occupied by the two diodes.

The result of this is that such a device for protecting against electrostatic discharges occupies a relatively large area of the substrate. In general, an integrated electronic circuit comprises several terminals, each one having to be protected against electrostatic discharges, so that all the protective devices of the electronic circuit require a particularly large area of the substrate. Correlatively, an electronic circuit protected in this way against electrostatic discharges therefore has a high cost.

SUMMARY OF THE INVENTION

One aim of the present invention consists in reducing the area of the substrate occupied by a protective device of the type described above.

Thus, the present invention provides a device for protecting an electronic circuit against electrostatic discharges, which comprises a connection terminal linked to one terminal of said electronic circuit, a first track linked to a first terminal of an electrical power source supplying said electronic circuit, a second track linked to a second terminal of the electrical power source, so that the first track has a higher electrical potential than the second track. The electrostatic protective device further comprises a first diode having a cathode linked to the first track and an anode linked to the connection terminal, and a second diode having a cathode linked to the connection terminal and an anode linked to the second track, the first and second diodes being placed on the surface of a substrate. The connection terminal is carried by said substrate, and is located above part of at least one of the first and second diodes with respect to the substrate, in a direction perpendicular to the surface of the substrate.

A protective device according to the invention occupies a smaller region of the substrate, compatible with a high level of integration. This results in a reduction of costs, associated with reducing the size of the substrate.

Another advantage of a protective device according to the invention is the reduction in the distances separating the various elements of the protective device. Specifically, when an electrostatic discharge occurs, the number of electric charges having to be conveyed by various elements of the protective device may be high. Too great a conduction distance then causes heating which may damage the protective device itself. The compactness of the protective device according to the invention is consequently particularly advantageous.

According to a preferred embodiment of the invention, the first and second tracks are also carried by the substrate, and each have part of the track at least partially located between, on the one hand, said part of at least one of the first and second diodes and, on the other hand, the connection terminal. The region of the substrate occupied by the protective devices is then even smaller, and may possibly be limited approximately to a region corresponding to a projection of the connection terminal onto the surface of the substrate, in a direction perpendicular to the surface of the substrate.

The invention also relates to an electrical device comprising an electronic circuit and an associated device for protecting against electrostatic discharges as described above. The electronic circuit has a terminal linked to the connection terminal of the protective device. The first and second tracks of the protective device are respectively linked to a first and second terminals of a power source supplying the electronic circuit, such that the first track has an electric potential greater than an electric potential of the second track. The electrical device may further comprise a voltage limiter, or "clamp", connected to the first track and to the second track.

Preferably, the electronic circuit and the associated protective device are carried by one and the same substrate, thus reducing the overall cost of the device and increasing the efficiency of the protection provided against electrostatic discharges. Specifically, the closer the protective device to the electronic circuit, the more efficient this protection.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; and the phrases "associated with" and "associated therewith," as well derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. It should be noted that the functionality associated with any particular apparatus or controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

Other particular features and advantages of the present invention will become apparent in the description below of a non-limiting exemplary embodiment, with reference to the appended drawings, in which like reference numerals represent like parts, in which.

DETAILED DESCRIPTION

Figure 1:
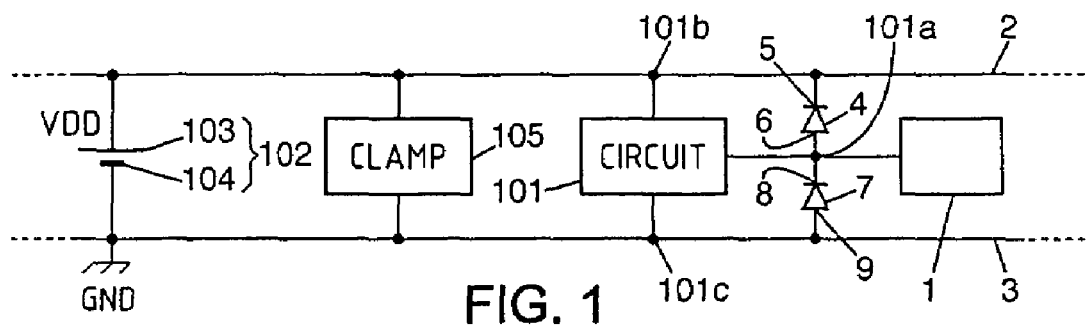
FIG. 1 illustrates an exemplary embodiment of a circuit diagram of a device according to the present invention.
Figure 2:
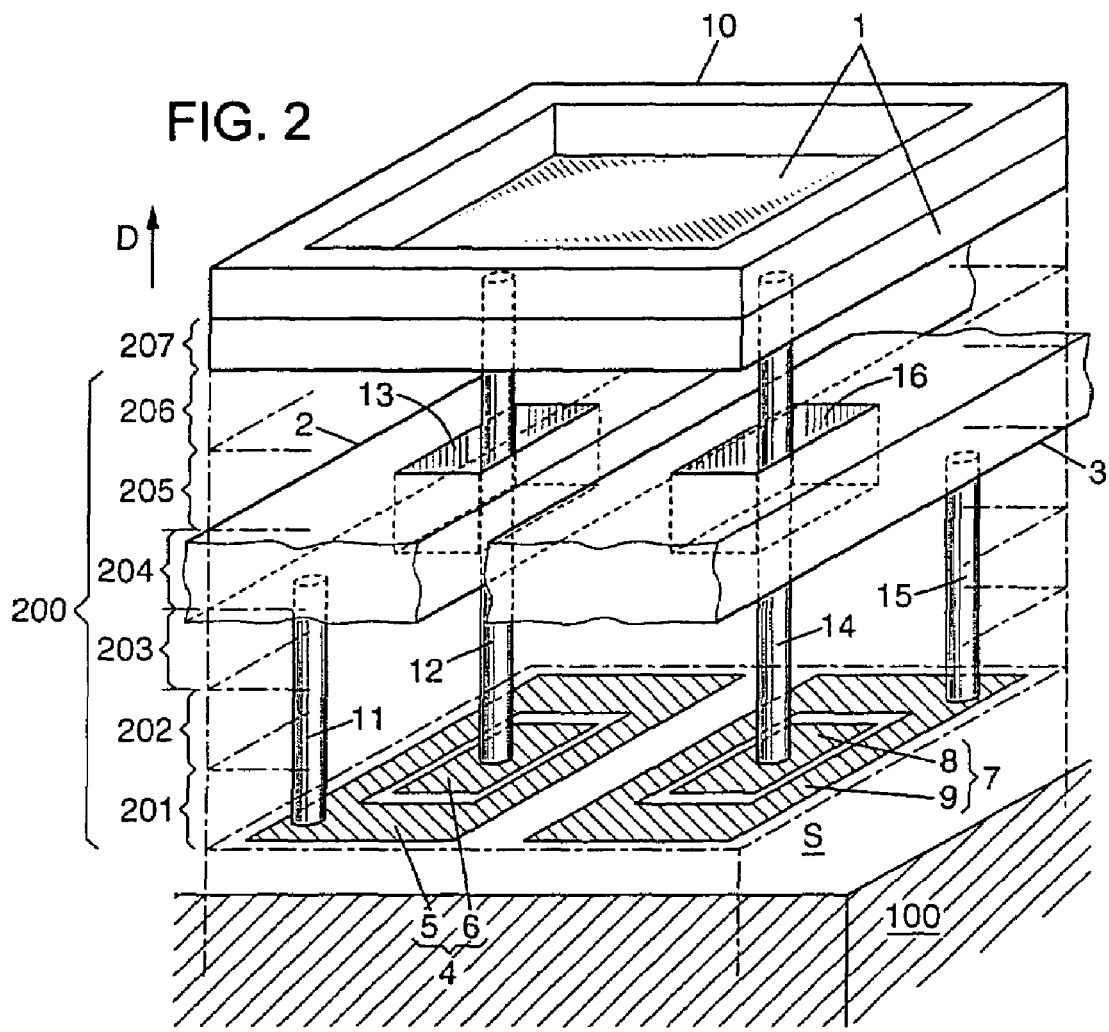
FIG. 2 illustrates an exemplary embodiment of a perspective diagram showing the implantation of a device according to the invention on silicon.
Figure 3:
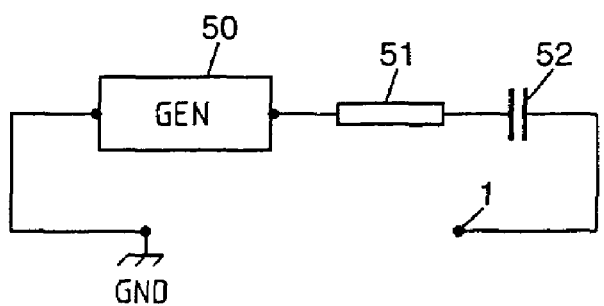
FIG. 3 illustrates an exemplary embodiment of a circuit diagram of a circuit for evaluating the robustness of the device of FIG. 2 with respect to pulses of electric current.

FIGS. 1 through 3, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged image processing system.

For reasons of clarity, the dimensions of the various circuit parts shown in the figures are not in proportion to the actual dimensions. Identical references indicated on the figures correspond to identical elements. The terms "upper", "lower", "on" and "under" used hereinbelow are defined with reference to a direction D, shown in FIG. 2, which is the direction perpendicular to the surface of the substrate.

FIG. 1 illustrates an exemplary embodiment of a circuit diagram of an electrostatic protective device known to a person skilled in the art, to which the invention is applicable. The protective device is linked to an electronic circuit 101 it is intended to protect against electrostatic discharges. For this, one terminal 101a of the circuit 101 is connected to a connection terminal 1, by means of which the circuit 101 may be linked to any external device, by means of a metal wire or a metal ball placed on the connection terminal 1, in a manner known to a person skilled in the art.

The circuit 101 is supplied by a DC voltage source 102, having a first output terminal 103 with an electrical potential VDD which is positive with respect to an electrical potential reference point, and a second output terminal 104 connected to said electrical potential reference point. Said electrical potential reference point may form an electrical earth for the circuit, denoted by GND in the figure. Two metal rails 2 and 3, with cross sections large enough to provide high electrical conductivity, are respectively connected to the output terminals 103 and 104 of the source 102. The rails 2 and 3 are also connected to supply terminals, respectively 101b and 101c, of the circuit 101.

A diode 4 is linked by its cathode 5 to the rail 2, and by its anode 6 to the connection terminal 1, and a diode 7 is linked by its cathode 8 to the connection terminal 1, and by its anode 9 to the rail 3. The diodes 4 and 7 each have high conductivity which can be obtained by a long junction region. A voltage limiter 105, or "clamp", is also linked between the rails 2 and 3 in parallel with the voltage source 102. Thus electric charges coming from a positive electrostatic discharge occurring on the connection terminal 1 are conducted by the diode 4 and the rail 2, then are removed to earth GND by the voltage limiter 105. Electrical charges coming from a negative electrostatic discharge occurring on the connection terminal 1 are conducted by the diode 7 and the rail 3 to earth GND. In both cases, the electrical charges in question do not pass through the circuit 101 which is thus protected.

FIG. 2 illustrates an exemplary embodiment of one implantation, on a substrate, of a device for protecting against electrostatic discharges, made according to the principles of the present invention.

The various components of the protective device, that is the connection terminal 1, the two rails 2 and 3 and the two diodes 4 and 7 are placed on a substantially flat substrate 100. The substrate 100 also carries the circuit 101 and the voltage limiter 105, not shown in FIG. 2. The substrate 100 is made of a semiconductor such as, for example, silicon, which may be single-crystal silicon. D is a direction perpendicular to the surface S of the substrate 100, oriented towards the outside of the substrate 100.

It is normal to place the connection terminals such as the terminal 1 is close to the periphery of the substrate 100, so as to facilitate access to these connection terminals. The electrical connection of these terminals to devices external to the circuit, especially by means of conducting wires, is thus made easier.

The diodes 4 and 7 are made on the surface S of the substrate 100, in a manner known to a person skilled in the art. Preferably, the cathode 5 of the diode 4 is placed around the anode 6 of the diode 4, in the plane of the surface S. Conversely, the cathode 8 of the diode 7 is surrounded by the anode 9 of the diode 7 in the plane of the surface S. The regions referenced 5, 6, 8 and 9, shown in FIG. 2, are the respective contact regions of the cathode and of the anode of each of the two diodes 4 and 7. The diodes 4 and 7 are electrically insulated from each other, and placed side by side, so that both diodes come within a rectangle, preferably a square, in the plane of the surface S.

Several metallization levels 201–206 are placed above the surface S, for example using the "Damascene" method or its variant, the "dual Damascene" method known to a person skilled in the art. According to the Damascene method, the rails 2 and 3, together with the electrical connections, are made within the layers of insulating material superimposed in the direction D above the substrate 100. To do this, each layer is etched through a lithography mask which has an opening corresponding to a section, in a plane perpendicular to the direction D, of one of the desired elements from among the track 2, the track 3 or the electrical connections. Spaces thus etched are filled with metal, using a method which, for example, comprises an electrolytic deposition step, known to a person skilled in the art. The mask is withdrawn, and polishing is carried out in order to remove excess metal deposited. The following insulating layer is then produced.

The rails 2 and 3 are thus made, for example, of copper, aluminium, silver or any other conductor having high electrical conductivity. Preferably, they are parallel to each other, juxtaposed in a plane parallel to the surface S, while being electrically insulated from each other. They have respective portions placed respectively above diodes 4 and 7. The rail 2 has an opening 13 placed above the anode 6 of the diode 4, and the rail 3 has an opening 16 placed above the cathode 8 of the diode 7.

The connection terminal 1 is placed on the upper face of the electronic circuit, for example, in a seventh metallization level 207. A metal connection wire, not shown, is intended to be fixed by soldering to the connection terminal 1. A frame 10 made of an electrically insulating refractory material is placed above the connection terminal 1 so as to prevent any overspill of solder or metal when fixing the metal wire to the upper face of the connection terminal 1. The frame 10 may, for example, be made of silicon nitride.

The connection terminal 1 may have, for example, a square shape with sides having a length of between 90 and 100 micrometres, in a plane parallel to the surface S. Such a connection terminal is called a "pad", in the jargon of a person skilled in the art.

In the embodiment illustrated in FIG. 2, the assembly formed by the two diodes 4 and 7 is included inside a region corresponding to the projection of the connection terminal 1 onto the surface S, parallel to the direction D. Furthermore, the two rails 2 and 3 each have respective segments of rail length completely located inside the cylinder having the connection terminal 1 as base and the direction D as axis. Such an arrangement of the device for protecting against electrostatic discharges is particularly compact, by virtue of the superposition, in the direction D, of the connection terminal 1, the rails 2 and 3 and the diodes 4 and 7 in respective circuit levels in the direction D.

Electrical connections extending in the direction D, for example vias, connect some of the components of the device. This includes, for example:
a via 11 connecting the cathode 5 of the diode 4 to the track 2;
a via 12 connecting the anode 6 of the diode 4 to the connection terminal 1;
a via 14 connecting the cathode 8 of the diode 7 to the connection terminal 1; and/or,
a via 15 connecting the anode 9 of the diode 7 to the track 3.

The vias 12 and 14 respectively pass through the rails 2 and 3 by the respective openings 13 and 16 of the rails 2 and 3. The vias 11 and 12 are electrically insulated from the rails 2 and 3.

Optionally, several vias, for example four or eight vias arranged in matrices in planes parallel to the surface S, may replace each of the vias 11, 12, 14 and 16, so as to obtain a greater electrical current conductivity between each of the components of the device for protecting against electrostatic discharges. Thus the protective device may be effective against electrostatic discharges corresponding to higher numbers of electric charges.

For an electronic circuit equipped with such a protective device comprising a circuit part operating at radio frequencies (RF, that is to say of the order of about 500 kilohertz to 2 megahertz), the rails 2 and 3 are placed in metallization levels close to the surface S of the substrate 100, so as to obtain lower electrostatic interaction ability between the rails 2 and 3 and the connection terminal 1. When the rails 2 and 3 are made in the metallization level 201 or 202, the ability of each of the rails to interact with the connection terminal 1 is then of the order of or less than 30 picofarads.

For an electronic circuit equipped with such a protective device and not having RF operational limits, each of the two rails 2 and 3 placed, for example, in the level 201, may be duplicated in each metallization level 202–206, so as to obtain an overall higher electrical current conductivity. The duplication rails thus placed in at least some of the metallization levels 202 to 206 are identical to the rail 2 or 3 to which they correspond respectively, and are connected together as well as to the rail 2 or 3 to which they are joined by means of regularly spaced vias between all these rails.

According to a normal arrangement not using the invention, the connection terminal 1, described above, with the associated frame 10 is placed on a substrate in a first region of this substrate. The other elements of the device for protecting against electrostatic discharges are placed in a second region of this substrate which is distinguished from the first region. Said first and second regions have approximately identical dimensions. The application of the invention makes it possible to merge the first and second regions, which reduces the area of the substrate occupied by the protective device by a factor approximately equal to two, compared with the usual arrangement. For a substantially square electronic circuit with a side length of about 3 millimetres made on a flat substrate and having protection against electrostatic discharges associated with about a hundred of its input terminals, the saving in area may be greater than 13%. This saving enables increased miniaturization of an electrical device comprising the circuit, and therefore a decrease in its cost price.

Tests for robustness with respect to electrostatic discharges were carried out according to the standard "ESD Association Standard Test Method for Electrostatic Discharge (ESD) Sensitivity Testing—Human Model Component Level ESD STM 5.1 (1998)", on an electronic circuit comprising a device for protecting against electrostatic discharges as described above with reference to FIG. 2. According to this standard, an electric current pulse is produced by a current generator connected, on the one hand, to the connection terminal 1 and, on the other hand, to the earth terminal GND, according to the exemplary circuit diagram of FIG. 3. The generator 50 is connected to the terminal 1 via a 1.5 kilo-ohm resistor 51 and a 100 picofarad capacitor 52 connected in series.

The current pulse delivered by the generator 50 has a rapid increase in intensity for, for example, 10 nanoseconds, up to an instantaneous maximum value set according to a required discharge voltage level. The electronic circuits equipped with protective devices as described with reference to FIG. 2 have not been damaged by electrostatic discharges corresponding to discharge voltage levels greater than 2.2 kilovolts. In particular, there is no breakdown of insulator between the rails 2 and 4, nor between each rail 2, 3 and the connection terminal 1, nor between each rail 2, 3 and the cathode 5/8 or the anode 6/9 of each of the diodes 4 and 7.

Such protective devices consequently guarantee immunity of the electronic circuits to which they are joined against electrostatic discharges occurring on the connection terminals thus protected during handling by an operator.

Moreover, tests were carried out to evaluate the mechanical resistance of devices for protecting against electrostatic discharges as described with reference to FIG. 2. Specifically, pressure is exerted on the connection terminal 1 when soldering a metal connection wire to the upper surface of this terminal. An industrial soldering robot was used for these tests, which applies the end of a metal wire to the upper surface of the terminal 1, heats this end then solders it. The metal wire is then drawn some distance from the connection terminal 1 by the robot. During these mechanical resistance tests, no deformation nor crushing of the device for protecting against electrostatic discharges according to the invention was observed, nor any impairment to its electrical operation. It is intended that the present invention encompass such changes and modifications as fall within the scope of the appended claims.

What is claimed is:

1. A device for protecting an electronic circuit against electrostatic discharges, the device comprising:
   a connection terminal capable of being linked to one terminal of said electronic circuit,
   first and second tracks capable of being coupled respectively to first and second terminals of an electrical power source, wherein the first track has a higher electrical potential than the second track,
   a first diode having a cathode linked to the first track and an anode linked to the connection terminal, and
   a second diode having a cathode linked to the connection terminal and an anode linked to the second track,
   wherein the first and second diodes are associated with a surface of a substrate, the connection terminal and the first and second tracks are carried by said substrate, the connection terminal is located above at least part of one or more of the first and second diodes with respect to the substrate in a direction perpendicular to the surface of the substrate, and at least part of each of the first and second tracks is located between at least one of the first and second diodes and the connection terminal.

2. The device according to claim 1, wherein the anode of the first diode is surrounded by the cathode of the first diode in a plane parallel to the surface of the substrate, and wherein the anode of the first diode is linked to the connection terminal by at least one connection passing through one of the first and second tracks, the at least one connection being electrically insulated from the first and second tracks.

3. The device according to claim 1, wherein the cathode of the second diode is surrounded by the anode of the second diode in a plane parallel to the surface of the substrate, and wherein the cathode of the second diode is linked to the connection terminal by at least one connection passing through one of the first and second tracks, the at least one connection being electrically insulated from the first and second tracks.

4. The device according to claim 1, wherein both diodes are included inside a region corresponding to a projection of the connection terminal onto the surface of the substrate in the direction perpendicular to the surface of the substrate.

5. The device according to claim 4, wherein the first and second tracks each have respective segments of track length completely located inside a cylinder having the connection terminal as a base and the direction perpendicular to the surface of the substrate as an axis.

6. An electrical device comprising an electronic circuit and a device for protecting against electrostatic discharges, the device comprising:
   a connection terminal capable of being linked to one terminal of said electronic circuit,
   first and second tracks capable of being coupled respectively to first and second terminals of an electrical power source, wherein the first track has a higher electrical potential than the second track,
   a first diode having a cathode linked to the first track and an anode linked to the connection terminal, and
   a second diode having a cathode linked to the connection terminal and an anode linked to the second track,
   wherein the first and second diodes are associated with a surface of a substrate, the connection terminal and the first and second tracks are carried by said substrate, the connection terminal is located above at least part of one or more of the first and second diodes with respect to the substrate in a direction perpendicular to the surface of the substrate, and at least part of each of the first and second tracks is located between at least one of the first and second diodes and the connection terminal.

7. The electrical device according to claim 6, wherein the electronic circuit and the device for protecting against electrostatic discharges are both carried by the substrate.

8. The electrical device according to claim 6, further comprising a voltage limiter connected to the first track and to the second track.

9. The electrical device according to claim 6, wherein:
   the anode of the first diode is coupled to the connection terminal at a first connection point; and
   the cathode of the second diode is coupled to the connection terminal at a second connection point.

10. The electrical device according to claim 6, wherein:
    the first track has a first opening above the anode of the first diode in the direction perpendicular to the surface of the substrate; and
    the second track has a second opening above the cathode of the second diode in the direction perpendicular to the surface of the substrate.

11. The electrical device according to claim 10, wherein:
    one or more first connections between the connection terminal and the anode of the first diode pass through the first opening; and
    one or more second connections between the connection terminal and the cathode of the second diode pass through the second opening.

12. The electrical device according to claim 6, wherein:
    the anode of the first diode is surrounded by the cathode of the first diode in a plane parallel to the surface of the substrate; and
    the cathode of the second diode is surrounded by the anode of the second diode in the plane parallel to the surface of the substrate.

13. The electrical device according to claim 6, wherein both diodes are included inside a region corresponding to a projection of the connection terminal onto the surface of the substrate in the direction perpendicular to the surface of the substrate.

14. The electrical device according to claim 13, wherein the first and second tracks each have respective segments of track length completely located inside a cylinder having the connection terminal as a base and the direction perpendicular to the surface of the substrate as an axis.

15. A method, comprising:
    forming a first diode and a second diode;

forming first and second tracks capable of being coupled respectively to first and second terminals of an electrical power source, wherein the first track has a higher electrical potential than the second track; and forming a connection terminal capable of being coupled to an electronic circuit, the first diode having a cathode coupled to the first track and an anode coupled to the connection terminal, the second diode having a cathode coupled to the connection terminal and an anode coupled to the second track;

wherein the connection terminal, the diodes, and the tracks are carried by a substrate, the connection terminal overlaps at least part of one or more of the diodes in a direction perpendicular to a surface of the substrate, and at least part of each of the tracks is located between one or more of the diodes and the connection terminal.

16. The method according to claim 15, wherein:

the anode of the first diode is coupled to the connection terminal at a first connection point; and the cathode of the second diode is coupled to the connection terminal at a second connection point.

17. The method according to claim 15, wherein:

forming the first diode comprises forming the anode of the first diode surrounded by the cathode of the first diode in a plane parallel to the surface of the substrate; and forming the second diode comprises forming the cathode of the second diode surrounded by the anode of the second diode in the plane parallel to the surface of the substrate.

18. The method according to claim 15, wherein both diodes are formed inside a region corresponding to a projection of the connection terminal onto the surface of the substrate in the direction perpendicular to the surface of the substrate.

19. The method according to claim 15, wherein forming the first and second tracks comprises:

forming the first track with a first opening that overlaps the anode of the first diode in the direction perpendicular to the surface of the substrate; and forming the second track with a second opening that overlaps the cathode of the second diode in the direction perpendicular to the surface of the substrate; and further comprising:

forming one or more first connections between the connection terminal and the anode of the first diode that pass through the first opening; and forming one or more second connections between the connection terminal and the cathode of the second diode that pass through the second opening.

20. The device according to claim 1, wherein:

the anode of the first diode is coupled to the connection terminal at a first connection point; and the cathode of the second diode is coupled to the connection terminal at a second connection point.

* * * * *